United States Patent [19]
Kimura

[11] Patent Number: 5,962,842
[45] Date of Patent: Oct. 5, 1999

[54] MOUNTING APPARATUS FOR PHOTOELECTRIC CONVERTING DEVICE AND FABRICATION METHOD THEREOF

[75] Inventor: Masanobu Kimura, Kamakura, Japan

[73] Assignee: Kabushiki Kaisha Toshiba, Kawasaki, Japan

[21] Appl. No.: 08/900,867

[22] Filed: Jul. 25, 1997

[30] Foreign Application Priority Data

Aug. 30, 1996 [JP] Japan .................................. 8-231017

[51] Int. Cl.⁶ .............................. H04N 3/14; G03B 19/00
[52] U.S. Cl. .................................. 250/208.1; 250/214 R; 348/76
[58] Field of Search .......................... 250/208.1, 214 R, 250/214.1, 216, 239, 551; 348/76, 65; 358/482, 483

[56] References Cited

U.S. PATENT DOCUMENTS 5,506,401  4/1996  Segawa et al. ....................... 250/208.1

FOREIGN PATENT DOCUMENTS 6-18654  1/1994  Japan .
7-99214  4/1995  Japan .

Primary Examiner—Edward P. Westin
Assistant Examiner—Kevin Pyo
Attorney, Agent, or Firm—Pillsbury Madison & Sutro LLP

[57] ABSTRACT

An adhesive agent 116 is coated to a peripheral flat portion 115 of an optical glass 113. A center flat portion 114 is mounted to an opening portion 108 of a TAB tape 105 from the reverse side of which copper leads 107 are formed. Thus, the optical glass 113 and the TAB tape 105 are adhered. At this point, the center flat portion 114 and the TAB tape 105 are arranged almost on the same plane. Thus, protrusion of the adhesive agent 116 and foreign matter stuck on the optical glass 113 can be easily and securely removed.

10 Claims, 8 Drawing Sheets

MOUNTING APPARATUS FOR PHOTOELECTRIC CONVERTING DEVICE AND FABRICATION METHOD THEREOF

BACKGROUND OF THE INVENTION

1. Field of the Invention

The present invention relates to a mounting apparatus for a photoelectric converting device and a fabrication method thereof so as to accomplish a micro camera.

2. Description of the Related Art

In recent years, in the fields of medical machinery and industrial robotics that use micro cameras, needs for reducing the size and weight of such cameras are becoming strong. To satisfy such needs, a mounting apparatus of which an photoelectric converting device is wire-bonded and packaged with ceramics has been developed. As another example, a small mounting apparatus of which a CCD is directly disposed on a wiring board has been developed.

FIG. 9 shows a mounting apparatus disclosed as Japanese Patent Laid-Open Application No. Hei 7-99214. In this mounting apparatus, a CCD that is an photoelectric converting device is directly disposed on a substrate. The mounting apparatus is fabricated in the following fabrication steps. Copper leads 91b are formed on an insulation sheet 91a formed on a wiring board 91 (at step 1). An optical glass 92, an ultraviolet ray thermosetting type adhesive agent 93, and so forth are layered (at steps 2 and 3). Next, an anisotropic conductive paste 95 is coated on the copper leads 91b connected to the CCD 96 on the wiring board 91 (at step 4). The CCD 96 has gold bumps 96b. Electrode portions 96a and the gold bumps 96b of the CCD 96 are thermally fitted and thereby connected (at step 5).

As shown in FIG. 10, the CCD 96 connected to the wiring board 91 is housed in a housing 104 along with a signal processing board 101, a camera cable 102, a lens portion 103, and so forth. As a result, the fabrication of the micro camera is completed.

However, in such a conventional mounting apparatus for an photoelectric converting device, when the optical glass 92 and the wiring board 91 are adhered, foreign matter and protrusion of an adhesive agent take place and they adversely affect the picture quality of the photoelectric converting device.

In the mounting apparatus shown in FIG. 9, the optical glass 92 and the CCD 96 are very closely disposed so as to reduce the size of the camera. When a micro camera is used for a medical machine or the like, an optical lens with a wide angle and a large depth of focus is used. Thus, when a foreign matter 97 and a protrusion 93a of an adhesive agent 93 are present on the optical glass 92, they are imaged by the CCD 96 and displayed on a TV screen.

At step 3 shown in FIG. 9, when the foreign matter 97 stuck on the optical glass 92 is removed by a cotton rod 121 as shown in FIG. 12A, the foreign matter is dispersed in the vicinity of the wiring board 91. In addition, since it is very difficult to strictly control the coating condition of the adhesive agent, the protrusion of the adhesive agent deteriorates the yield.

Foreign matter takes place at the cutting surface of the wiring board 91 and the cutting surface of the optical glass 92. In addition, foreign matter is generated by humans. In a ¼-inch 400,000-pixel type CCD, the size of each pixel is as small as 5 μm. On the other hand, the size of foreign matter that can be found in the fabrication process is at most 50 μm. Thus, it is very difficult to control foreign matter smaller than 5 μm.

SUMMARY OF THE INVENTION

An object of the present invention is to solve the problem of picture deterioration due to foreign matter stuck on an optical member.

A first aspect of the present invention is a mounting apparatus for a photoelectric converting device, comprising a wiring board having a light penetrating portion, the photoelectric converting device being aligned with a light receiving surface of the photoelectric converting device, the wiring board being electrically connected to the photoelectric converting device and an optical member having a center flat portion and a peripheral flat portion, the thickness of the center flat portion being larger than the thickness of the peripheral flat portion, the center flat portion being mounted to the light penetrating portion of the wiring board, the peripheral flat portion being adhered to the wiring board.

A second aspect of the present invention is a mounting apparatus for a photoelectric converting device, comprising a wiring board having a light penetrating portion, the photoelectric converting device being aligned with a light receiving surface of the photoelectric converting device, the wiring board being electrically connected to the photoelectric converting device, a first optical member aligned and adhered with the light penetrating portion of the wiring board, and a second optical member aligned with the light penetrating portion of the wiring board and adhered to the first optical member.

A third aspect of the present invention is a method for fabricating a mounting apparatus for a photoelectric converting device, comprising the steps of aligning a light receiving surface of the photoelectric converting device with a light penetrating portion formed on a wiring board and electrically connecting the photoelectric converting device and the wiring board, forming an optical member having a center flat portion and a peripheral flat portion in such a manner that the thickness of the peripheral flat portion is smaller than the thickness of the center flat portion, and mounting the center flat portion of the optical member to the light penetrating portion of the wiring board and adhering the peripheral flat portion to the wiring board.

These and other objects, features and advantages of the present invention will become more apparent in light of the following detailed description of best mode embodiments thereof, as illustrated in the accompanying drawings.

DESCRIPTION OF PREFERRED EMBODIMENTS

Figure 1:
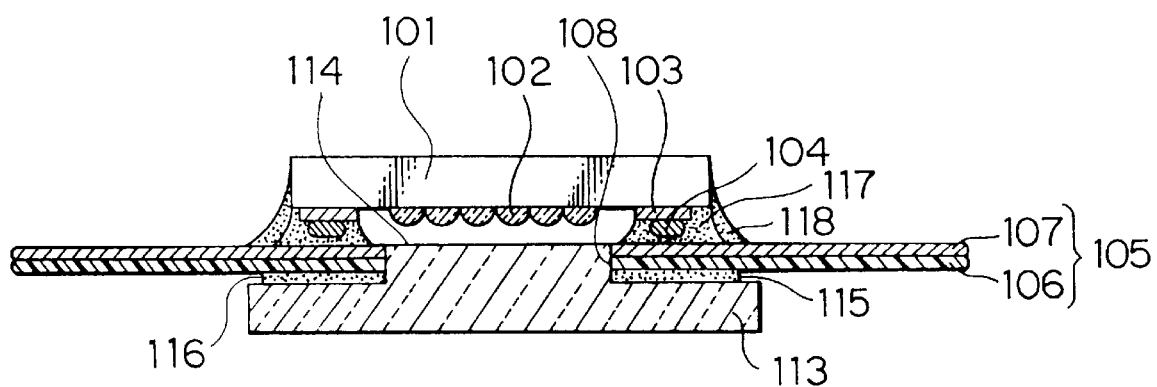
FIG. 1 is a sectional view for explaining a first embodiment of the present invention.

Next, with reference to the accompanying drawings, embodiments of the present invention will be described. FIG. 1 is a sectional view for explaining a first embodiment of the present invention. In FIG. 1, reference numeral 101 is a CCD. A micro lens 102 is formed on a light receiving surface of the CCD 101. A plurality of electrode pads 103 are formed along two sides of the CCD 101. Bumps 104 are formed on the individual electrode pads 103.

Figure 2:
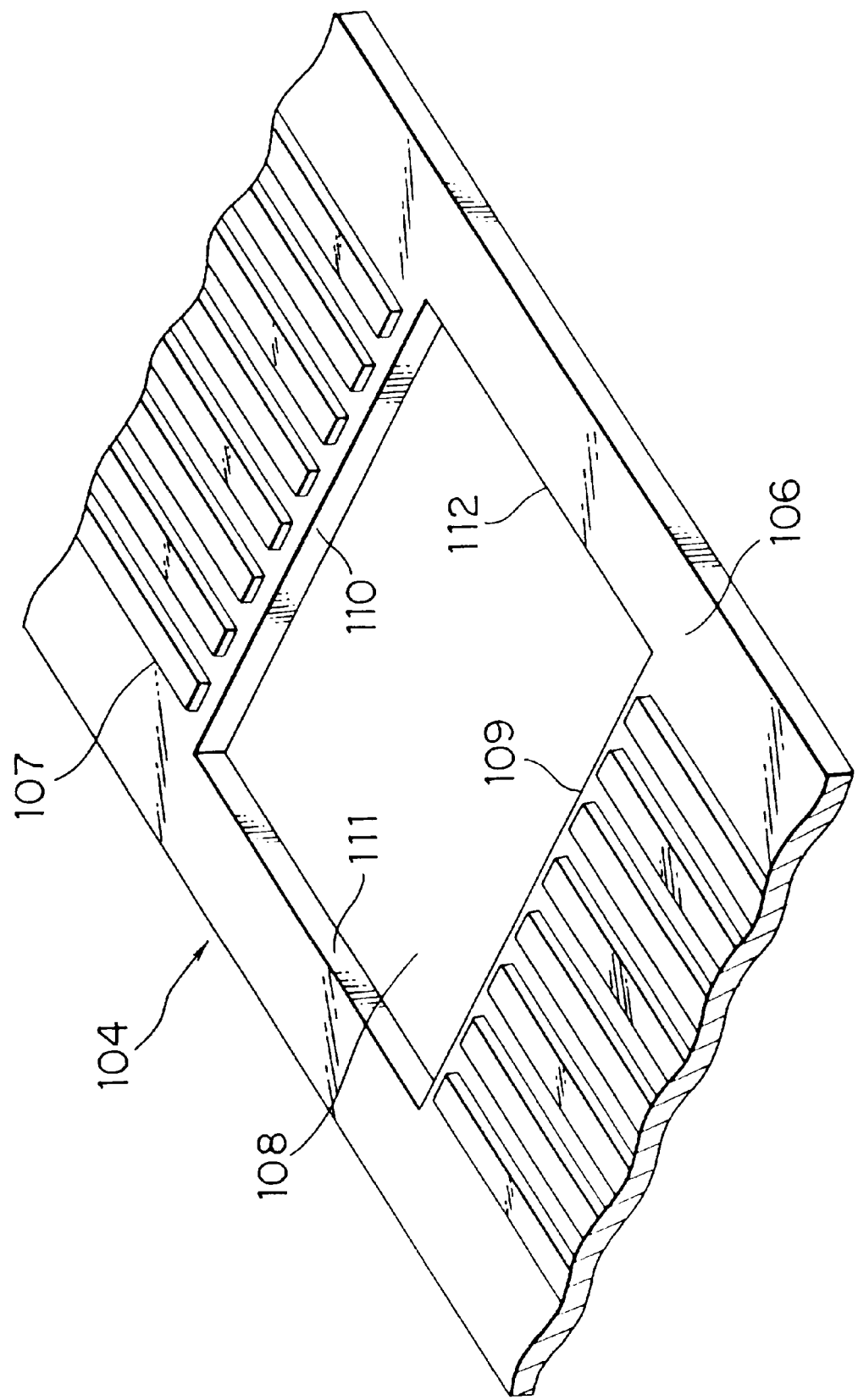
FIG. 2 is a perspective view showing a TAB tape shown in FIG. 1.

As shown in FIG. 2, a TAB (Tape Automated Bonding) tape 105 has a plurality of copper leads 107 formed on an insulation sheet 106. The TAB tape 105 can is freely folded. The insulation sheet 106 is composed of a resin of polyimide, polyamide, polyester, phenol, or glass epoxy or a composite substrate of paper and glass. The insulation sheet 106 has an opening portion 108 with for example a square shape. The opening portion 108 is formed so as to penetrate light.

The copper leads 107 are formed at predetermined intervals on the insulation sheet 106 along two opposite sides 109 and 110 of the opening portion 108. In other words, each of two adjacent copper sheets 107 is insulated with the insulation sheet 106. Referring to FIG. 2, the copper leads 106 are not formed on the insulation sheet 106 along other two opposite sides 111 and 112 of the opening portion 108.

However, it should be noted that the copper leads 107 can be formed on the insulation sheet 106 along the two opposite sides 111 and 112.

Figure 3:
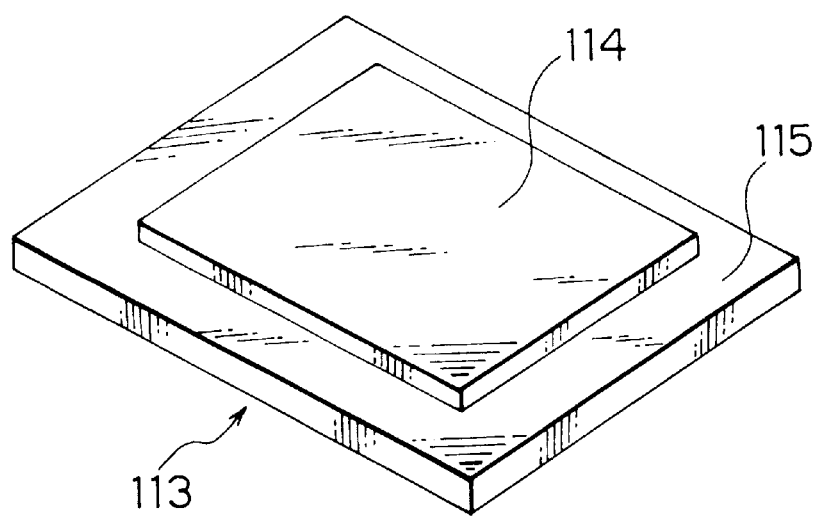
FIG. 3 is a perspective view showing an optical glass shown in FIG. 1.

As shown in FIG. 3, the size and shape of a center flat portion 114 of the optical glass 113 are designed so that the center flat portion 114 is fitted to the opening portion 108. The thickness of a peripheral flat portion 115 of the optical glass 113 is smaller than the thickness of the center flat portion 114 thereof. The gap between the center flat portion 114 and the peripheral flat portion 115 is equal to the thickness of the TAB tape 105.

An adhesive agent 116 is coated on the peripheral flat portion 115 of the optical glass 113. The center flat portion 114 is mounted to the opening portion 108 of the TAB tape 105 from the reverse side of which the copper leads 107 are formed. Thus, the optical glass 113 and the TAB tape 105 are adhered. At this point, the center flat portion 114 and the TAB tape 104 are arranged almost on the same plane.

Thus, an extrusion of the adhesive agent 116 and foreign matter on the optical glass 113 can be easily and securely removed. It is preferred to roughly form the surface of the peripheral flat portion 115 on which the adhesive agent 116 is coated so as to improve the adhering effect.

The copper leads 107 of the TAB tape 105 are electrically connected to the CCD 101 through an anisotropic conductive paste 117. The anisotropic conductive paste 117 is preferably formed along the sides 111 and 112 as well as the sides 109 and 110 on which the copper leads 107 are formed. The anisotropic conductive paste 117 has functions for mechanically connecting the TAB tape 105 and the CCD 101 and for sealing a hollow portion formed by the opening portion 108 and so forth along with a function for electrically connecting the copper leads 107 and the CCD 101.

It should be noted that a substrate that cannot be folded can be used instead of the TAB tape 105. The preferred color of the substrate is black so as to prevent light from being reflected thereon and thereby preventing unnecessary radiation from being entered therein. In this case, the substrate may be made of a black material. Alternatively, a black paint may be coated on the substrate. Likewise, the preferred color of the anisotropic conductive paste 117 is black so as to prevent light from being reflected thereon and thereby preventing unnecessary radiation from being entered therein.

A sealing resin 118 is formed on the optical glass 113 in such a manner that the sealing resin 118 covers the anisotropic conductive paste 117. The sealing resin 118 is made of for example phenol resin or epoxy resin. The sealing resin 118 is for example a heat and/or ultraviolet thermosetting type sealing resin. The sealing resin 118 reinforces the electric and mechanical connections of the TAP tape 105 and the CCD 101. However, in the CCD mounting apparatus according to the embodiment, the sealing resin 118 can be omitted. This is because the anisotropic conductive paste 117 has the function of the sealing resin 118. When the sealing resin 118 is omitted, the fabrication process can be simplified.

According to the embodiment, when the optical glass 109 is connected to the TAB tape 105 with an adhesive agent corresponding to the opening portion 108, since the optical glass 109 and the TAB tape 105 are arranged almost on the same plane, foreign matter and adhesive agent stuck on the optical glass 109 can be easily and securely removed.

Figure 4:
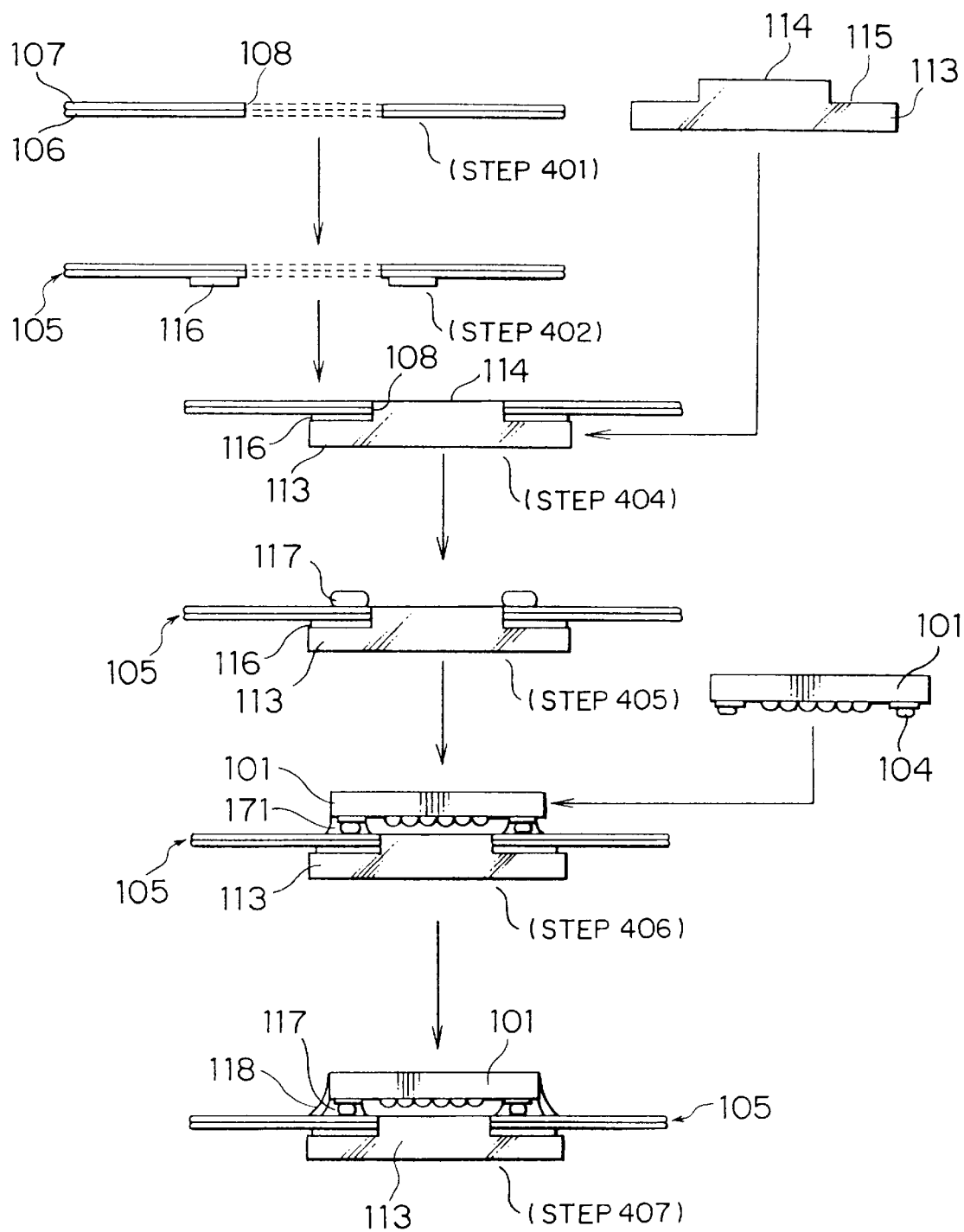
FIG. 4 is a sectional view showing fabrication steps of a CCD mounting apparatus according to the first embodiment of the present invention.

FIG. 4 shows a fabrication method of a mounting apparatus for a photoelectric converting device shown in FIG. 1. First of all, copper leads 107 are formed on an insulation sheet 106 by an etching method or the like (at step 401).

An adhesive agent 116 is coated on a surface of which the copper leads 107 of the TAB tape 105 have not been formed at step 401 (at step 402).

Next, an optical glass 113 is abraded and thereby a peripheral flat portion 115 and a center flat portion 114 are formed in such a manner that the thickness of the peripheral flat portion 115 is smaller than the thickness of the center flat portion 114 (at step 403). At this point, the peripheral flat portion 115 is abraded so that the thickness of the peripheral flat portion 115 becomes the same as the thickness of the TAB tape 105.

Figure 5:
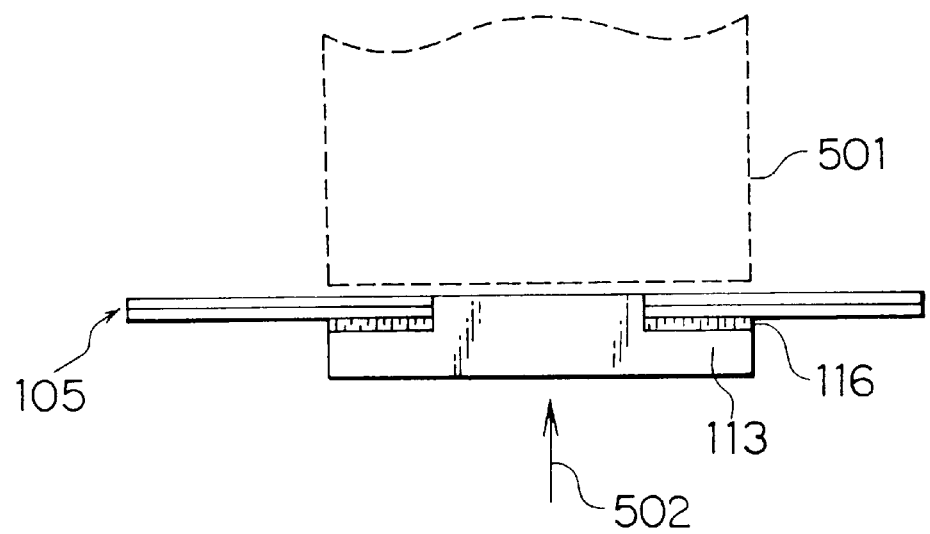
FIG. 5 is a sectional view for explaining a fabrication step for adhering the TAB tape and the optical glass.

While the center flat portion 114 of the optical glass 113 is being mounted to the opening portion 108 of the TAB tape 105, the optical glass 113 and the TAB tape 105 are adhered with an adhesive agent 116 (at step 404). At step 404, as shown in FIG. 5, the copper leads 107 are pressed with a pressing tool 501 from the top. Ultraviolet ray 502 is radiated from the rear side of the optical glass 113. Thus, the optical glass 113 and the TAB tape 105 can be adhered in a short time for several seconds to several ten seconds.

An anisotropic conductive paste 117 is formed on the TAB tape 105 by screen printing method or the like (at step 405). The anisotropic conductive paste 117 is made of a paste type material. The anisotropic conductive paste 117 is coated on the TAB tape 105 by dispenser method, screen printing method, or the like. Alternatively, the anisotropic conductive paste 117 may be made of a frame shaped film material so that it is placed on the TAB tape 105.

Thereafter, the TAB tape 105 and the CCD 101 with bumps 104 are connected through the anisotropic conductive paste 117 in such a manner that the copper leads 107 of the TAB tape 105 and the bumps 104 are aligned (at step 406). The copper leads 107 and the bumps 104 are connected by heating or pressing the anisotropic conductive paste 117. The anisotropic conductive paste 117 made by dispersing 3 to 30% of gold particles with a diameter of 1 to 10 μm in epoxy resin for example is used.

Last, a sealing resin 118 is heated or ultraviolet ray is radiated thereto so that the sealing resin 118 covers the anisotropic conductive paste 117 (at step 407). Alternatively, while the sealing resin 118 is being heated, ultraviolet ray may be radiated thereto.

In the CCD mounting apparatus according to the embodiment, since the center flat portion 114 of the optical glass 113 and the TAB tape 105 are arranged almost on the same plane at step 404, foreign matter and protrusion of the adhesive agent 116 stuck on the center plane portion 114 can be easily removed. Moreover, while the center flat portion 114 of the optical glass 113 is being mounted to the opening portion 108 of the TAB tape 105, the optical glass 113 and the TAB tape 105 are adhered with the adhesive agent 116. Thus, they can be securely aligned.

Figure 6:
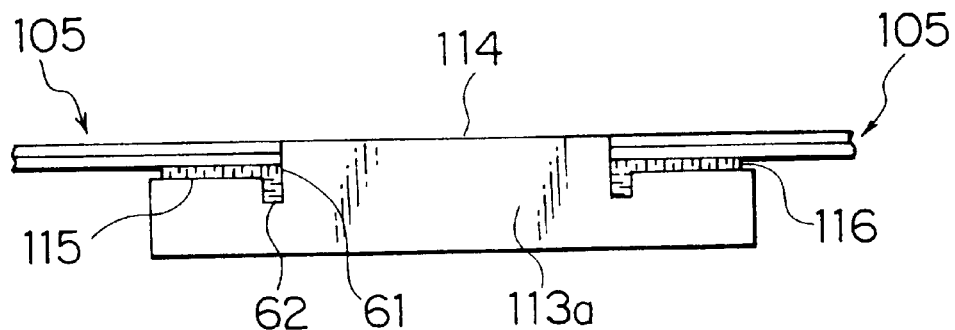
FIG. 6 is a sectional view for explaining a second embodiment of the present invention.

Next, with reference to FIG. 6, a second embodiment of the present invention will be described. FIG. 6 shows only a TAB tape and an optical glass. Thus, a CCD and its connection are omitted.

In the second embodiment, a groove portion 62 is formed at a peripheral flat portion 115 at a gap portion 61 between a center flat portion 114 and the peripheral flat portion 115 of an optical glass 113a so that the groove portion 62 surrounds the center flat portion 114. When an optical glass 113 and a TAB tape 105 are connected with an adhesive agent 116, the excessive adhesive agent 116 can be stored in the groove portion 62.

Since the excessive adhesive agent 116 is stored in the grove portion 62, the adhesive agent 116 can be prevented from protruding to the center flat portion 114. Thus, only foreign matter is stuck on the center flat portion 114. The foreign matter can be easily removed from the center flat portion 114.

Next, with reference to FIGS. 7 and 8, a third embodiment and a fourth embodiment of the present invention will be described. As with the second embodiment, in the third and fourth embodiments, a CCD and its connection are omitted.

Figure 7:
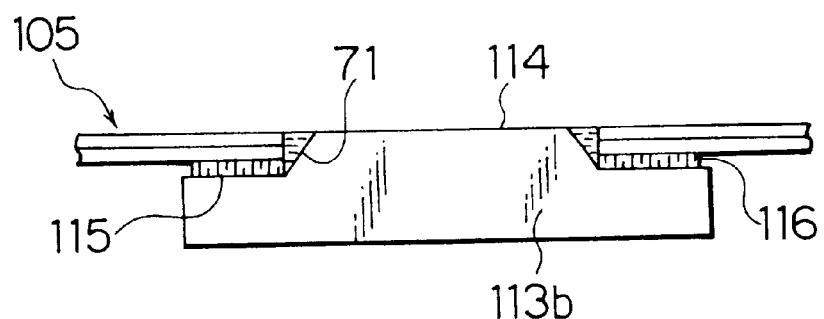
FIG. 7 is a sectional view for explaining a third embodiment of the present invention.

As shown in FIG. 7, according to the third embodiment, an inclined portion 71 is formed at a gap of a center flat portion 114 of an optical glass 113b and a peripheral flat portion 115. Thus, when an opening portion 108 of a TAB tape 105 is mounted to the center flat portion 114, an excessive adhesive agent 116 stuck on the peripheral flat portion 115 is stored in a groove portion 72 formed between the opening portion 108 and the inclined portion 71 and thereby the excessive adhesive agent 116 is prevented from protruding to the center flat portion 114.

According to the third embodiment, since the excessive adhesive agent 116 is prevented from protruding to the center flat portion 114, only foreign matter is stuck on the center flat portion 114. Thus, it is easy to remove the foreign matter from the center flat portion 114.

Figure 8:
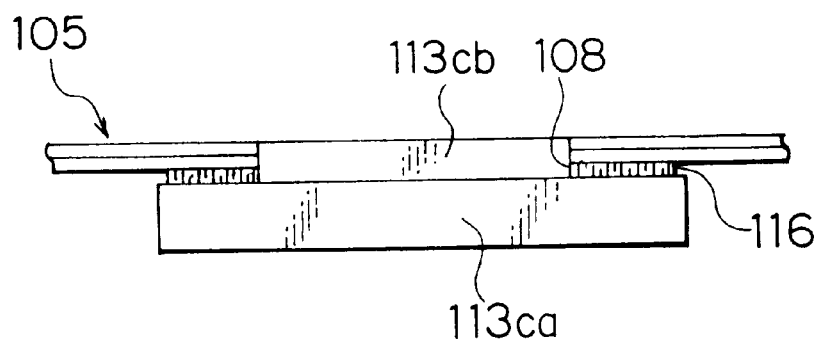
FIG. 8 is a sectional view for explaining a fourth embodiment of the present invention.
Figure 9:
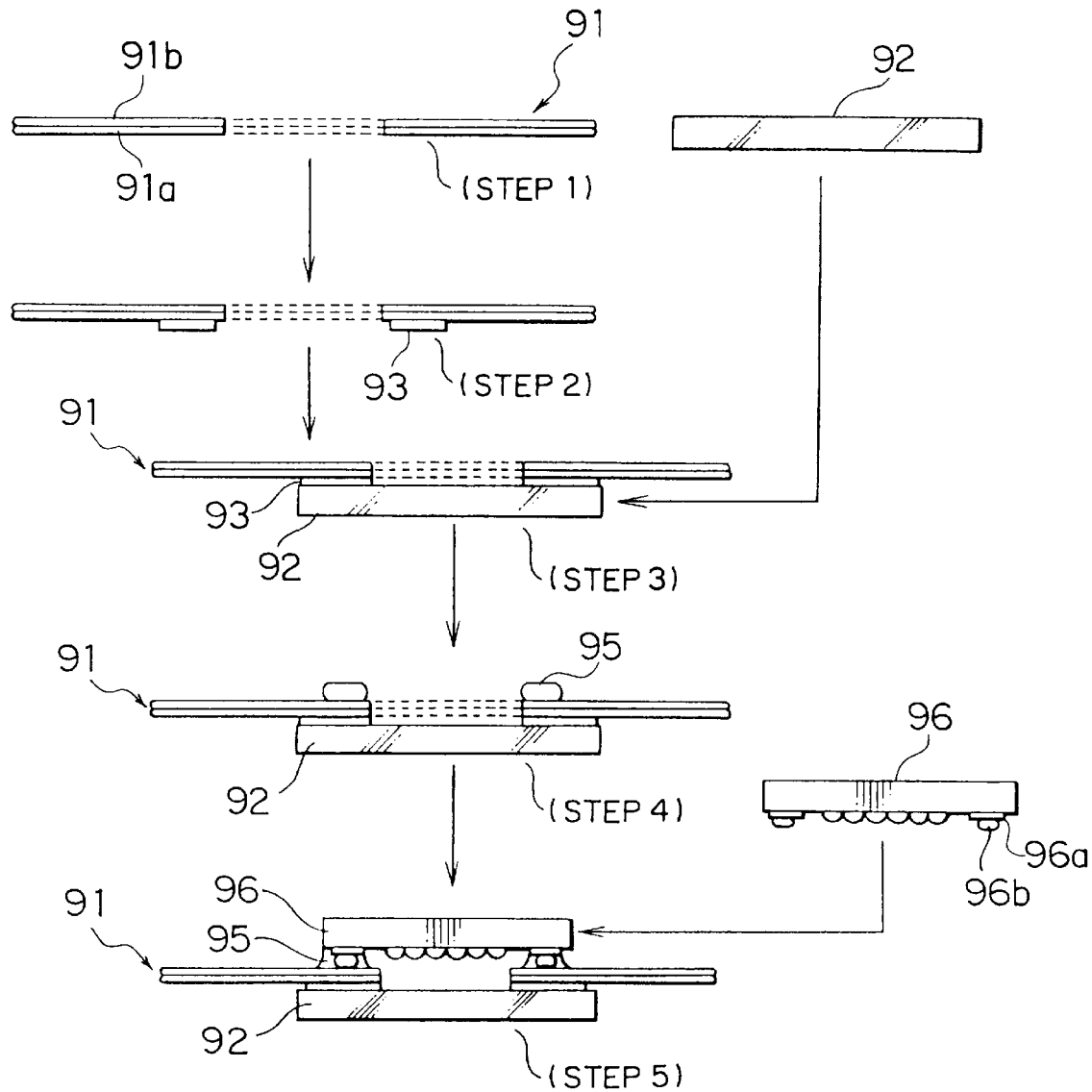
FIG. 9 is a schematic diagram showing fabrication steps for directly mounting a CCD to a substrate of a mounting apparatus according to a related art reference.
Figure 10:
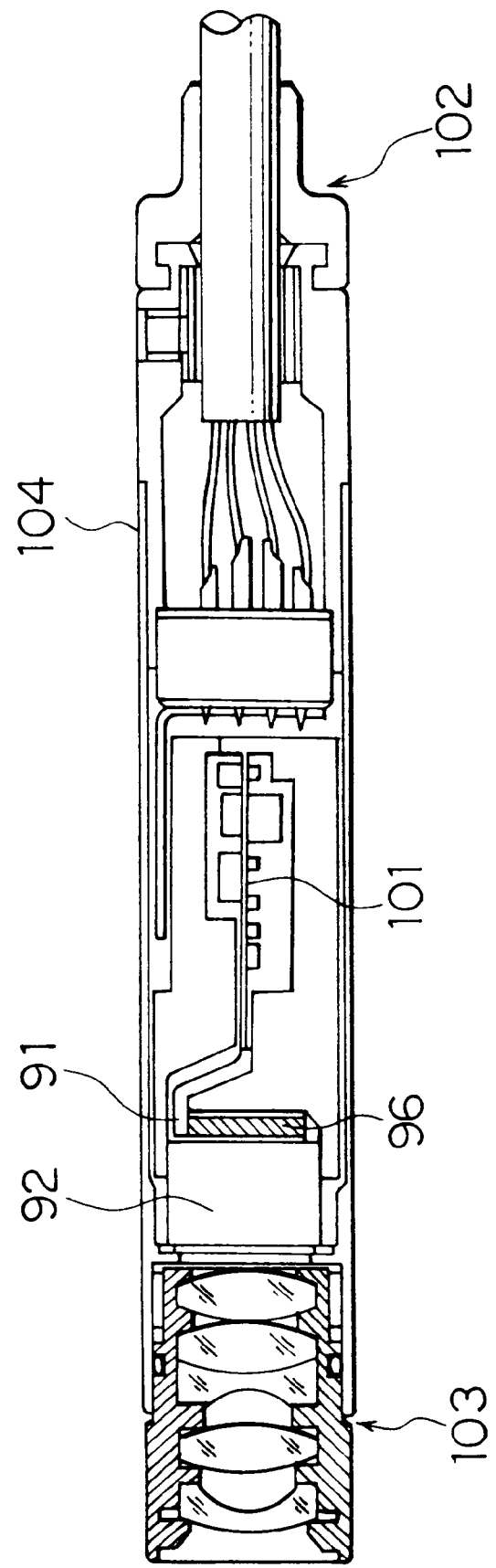
FIG. 10 is an exploded sectional view for explaining the state of which a CCD disposed on a substrate to a micro camera.
Figure 11:
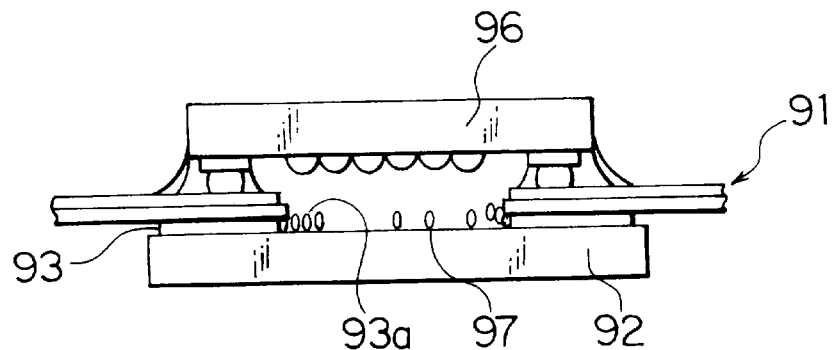
FIG. 11 is a sectional view for explaining a problem of the related art reference.
Figure 12A:
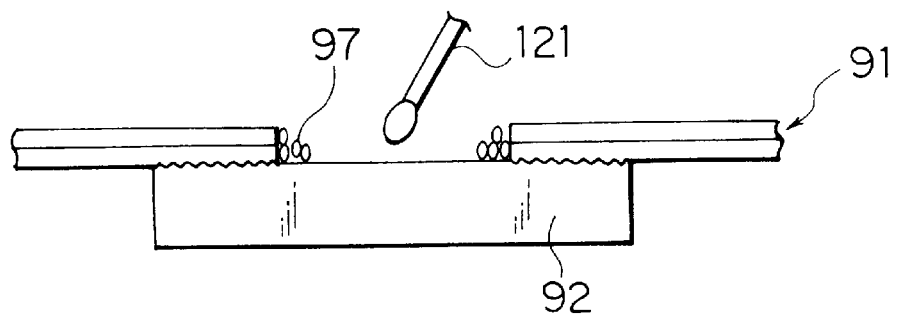
FIGS. 12A and 12B are sectional views for explaining a problem of the related art reference.
Figure 12B:
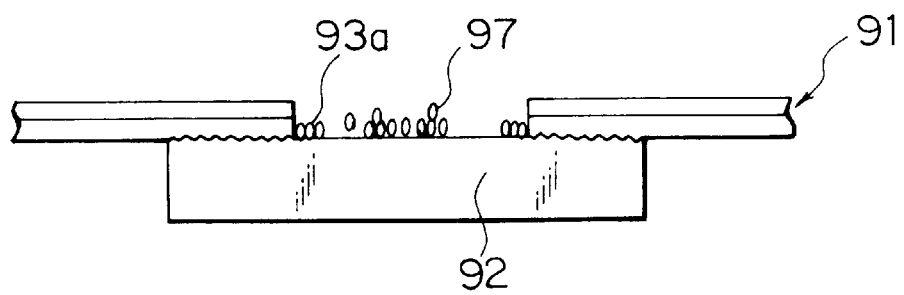

As shown in FIG. 8, according to the fourth embodiment, an optical glass 113cb is layered on an optical glass 113ca. The optical glass 113cb has the same shape as an opening portion 108 of a TAB tape 105 so that the optical glass 113cb can be mounted to the TAB tape 105.

According to the fourth embodiment, when the optical glass 113cb is layered on the optical glass 113ca, the resultant optical glass and a TAB tape can be arranged almost on the same plane free of foreign matter and protrusion of adhesive agent.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A mounting apparatus for a photoelectric converting device, comprising:

a wiring board having a light penetrating portion, the photoelectric converting device being aligned with a light receiving surface of the photoelectric converting device, the wiring board being electrically connected to the photoelectric converting device; and an optical member having a center flat portion and a peripheral flat portion, the thickness of the center flat portion being larger than the thickness of the peripheral flat portion, the center flat portion being mounted to the light penetrating portion of said wiring board, the peripheral flat portion being adhered to said wiring board.

2. The mounting apparatus as set forth in claim 1, wherein said optical member has a groove for storing excessive adhesive agent with which the peripheral flat portion is adhered to said wiring board.

3. The mounting apparatus as set forth in claim 1, wherein a stage portion of said optical member is inclined.

4. The mounting apparatus as set forth in claim 1, wherein a surface of said optical member adhered to said wiring board is roughly formed.

5. A mounting apparatus for a photoelectric converting device, comprising:

a wiring board having a light penetrating portion, the photoelectric converting device being aligned with a light receiving surface of the photoelectric converting device, the wiring board being electrically connected to the photoelectric converting device;

a first optical member aligned and adhered with the light penetrating portion of said wiring board; and a second optical member aligned with the light penetrating portion of said wiring board and adhered to said first optical member.

6. The mounting apparatus as set forth in claim 1 or 5, wherein the photoelectric converting device and said wiring board are electrically connected with an anisotropic conductive paste.

7. The mounting apparatus as set forth in claim 6, wherein the anisotropic conductive paste is formed around the light receiving surface of the photoelectric converting device.

8. A method for fabricating a mounting apparatus for a photoelectric converting device, comprising the steps of:

forming an optical member having a center flat portion and a peripheral flat portion, the thickness of the center flat portion being larger than the thickness of the peripheral flat portion;

aligning the center flat portion of the optical member with a light penetrating portion formed on a wiring board and adhering the optical member and the wiring board; and electrically connecting the photoelectric converting device to the wiring board.

9. A method for fabricating a mounting apparatus for a photoelectric converting device, comprising the steps of:

aligning a light receiving surface of the photoelectric converting device with a light penetrating portion formed on a wiring board and electrically connecting the photoelectric converting device and the wiring board;

forming an optical member having a center flat portion and a peripheral flat portion in such a manner that the thickness of the peripheral flat portion is smaller than the thickness of the center flat portion; and mounting the center flat portion of the optical member to the light penetrating portion of the wiring board and adhering the peripheral flat portion to the wiring board.

10. The method as set forth in claim 8 or 9, wherein the electrically connecting step is performed with an anisotropic conductive paste.

* * * * *